United States Patent
Asselin

[11] Patent Number: 5,604,651
[45] Date of Patent: Feb. 18, 1997

[54] READ HEAD WITH 4-POINT MAGNETORESISTIVE SENSING

[75] Inventor: Pierre Asselin, Santa Barbara, Calif.

[73] Assignee: Applied Magentics Corporation, Goleta, Calif.

[21] Appl. No.: 521,793

[22] Filed: Aug. 31, 1995

Related U.S. Application Data

[63] Continuation of Ser. No. 200,745, Feb. 23, 1994, abandoned.

[51] Int. Cl.⁶ .................................................. G11B 5/127
[52] U.S. Cl. ............................................ 360/113; 324/252
[58] Field of Search ........................... 360/110, 31, 113, 360/67; 338/32 R; 324/252

[56] References Cited

U.S. PATENT DOCUMENTS

| | | | |
|---|---|---|---|
| 4,535,375 | 8/1985 | Mowry et al. | 360/113 |
| 4,679,107 | 7/1987 | Imakoshi et al. | 360/113 |
| 4,841,398 | 6/1989 | Mowry | 360/113 |
| 5,097,372 | 3/1992 | Fukazawa et al. | 360/113 |
| 5,155,643 | 10/1992 | Jones, Jr. et al. | 360/113 |
| 5,216,560 | 6/1993 | Brug et al. | 360/113 |
| 5,331,492 | 7/1994 | Komai et al. | 360/113 |

*Primary Examiner*—Andrew L. Sniezek
*Attorney, Agent, or Firm*—Michaelson & Wallace

[57] ABSTRACT

A read head assembly senses data recorded on tracks of a moving magnetic media. The read head includes a magnetoresistive sensor element for sensing data, and a circuit connected to the sensor element. The circuit is used to electrically activate the sensor element and to monitor the voltage across an active sensing portion of the sensor element which is representative of the data. However, the circuit accomplishes this function without creating longitudinal magnetic fields near the active sensing portion. This reduces a source of magnetic instability and enhances the ability of the sensor element to read data from the track of the moving magnetic media, regardless of the width of the track.

18 Claims, 1 Drawing Sheet

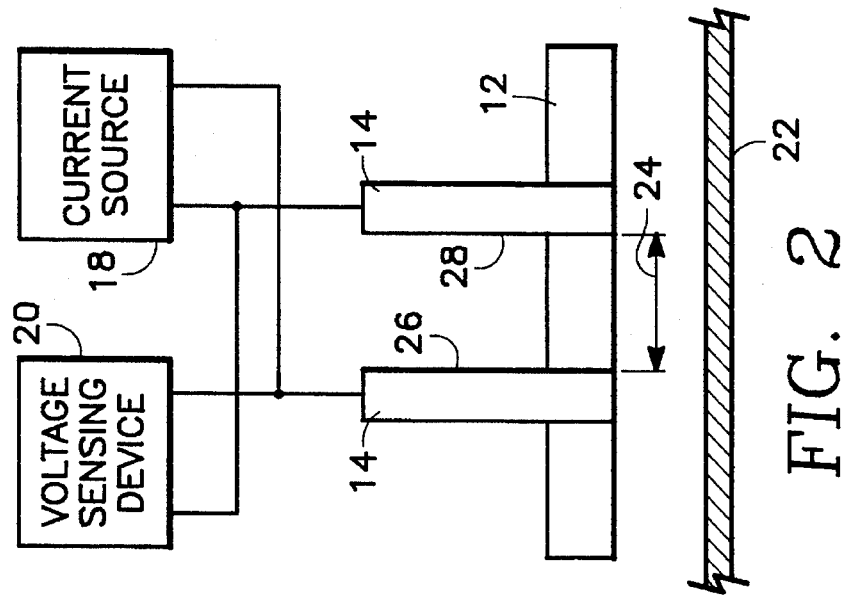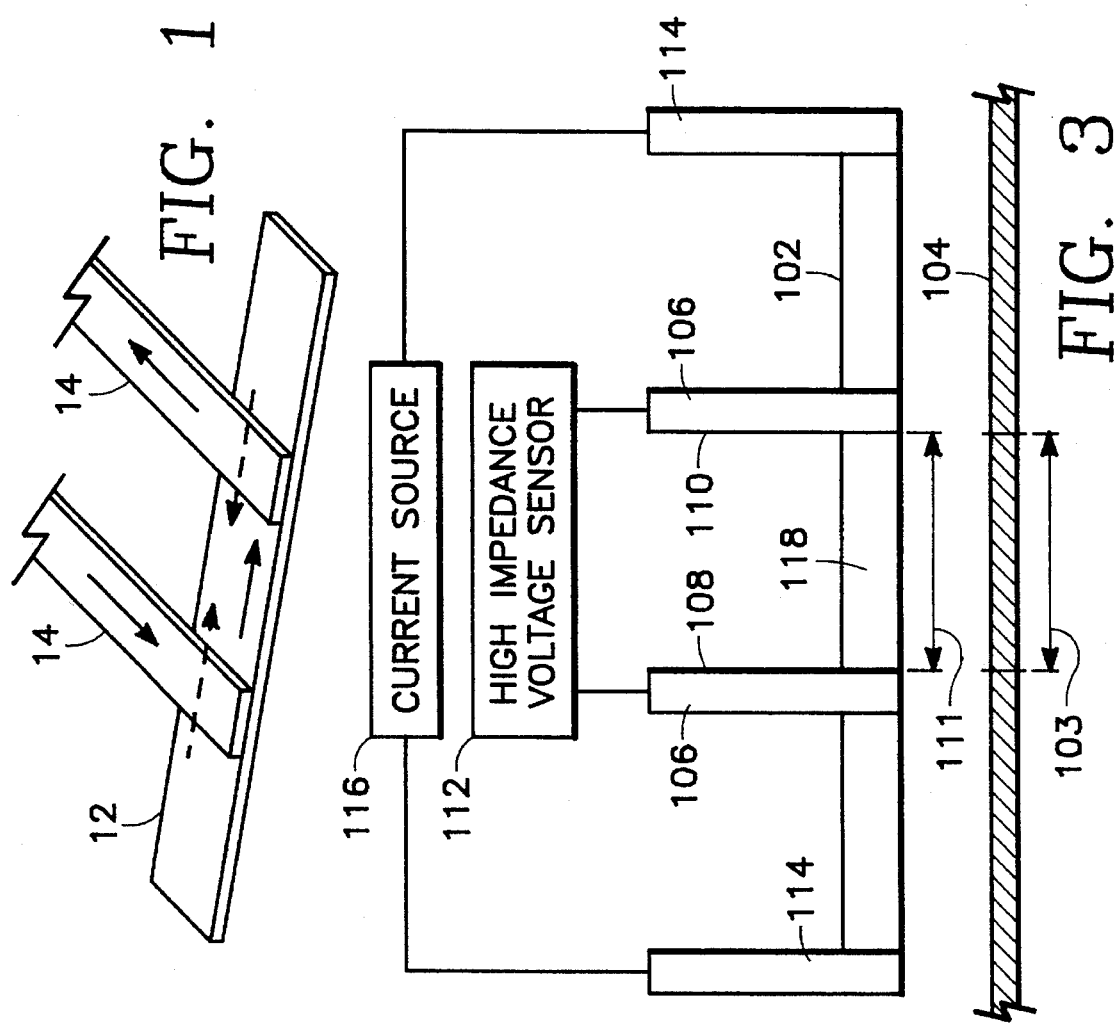

READ HEAD WITH 4-POINT MAGNETORESISTIVE SENSING

CROSS-REFERENCE TO RELATED APPLICATIONS

The present application is a continuation of U.S. Pat. application Ser. No. 08/200,745, filed Feb. 23, 1994, now abandoned.

BACKGROUND OF THE INVENTION

1. Technical Field

This invention relates to a read head assembly for sensing recorded data from tracks on moving magnetic media, such as magnetic tape, floppy disks or hard disks, and, more particularly, to a magnetoresistive read head with 4-point sensing.

2. Background Art

Typical magnetoresistive read heads include a magnetoresistive strip which functions as a sensing element. The strip is used to sense the recorded data from the track of the moving magnetic media. The data recorded on a section of the track applies a magnetic field to the strip when the strip is adjacent to the track. Essentially, the strip is a thin layer of a magnetically sensitive material, such as permalloy whose resistance varies under applied magnetic fields. Thus, the data recorded on the media track causes the resistance of the strip to vary. Monitoring the resistance of the strip allows the data to be read.

The resistance of the magnetoresistive strip is measured by forcing a predetermined amount of current through sensing leads and into the stripe. The voltage is then measured across the leads. Any change in voltage indicates a change in the resistance of the portion of the strip between the leads. Accordingly, the track is delimited by the distance between the sensing leads, not the size of the stripe.

These magnetoresistive read heads are subject to an extreme form of "wiggle" or "Barkhausen noise". To stabilize the head and minimize the noise, it is essential to control the domain structure of a magnetoresistive stripe. Ideally, the portion of the magnetoresistive strip which actively senses the recorded data from the track of the magnetic media (i.e. the area between the sensing leads) should be in a single-domain state. However, even if a single-domain state is substantially achieved, a problem arises when the track width is set too narrow.

A narrow track width is important. Recent advances in the art of magnetic data storage have resulted in improved storage densities. Typically, these improved storage densities are achieved by use of higher track densities in which recorded data is stored in tracks narrower than those used previously. The narrower the track, the more data that can be stored on the media. Wide-track magnetoresistive heads are known to have worked very well. However, narrow-track heads needed for improved storage densities have been found to be noisy. The degraded performance is caused, in part, by the current forced through the strip at the same portion of the strip used to sense data on the media. The current affects the domain states of the magnetoresistive material in the portion of the strip between the sensing leads.

FIG. 1 shows a perspective view of the magnetoresistive strip 12 and the sensing leads 14. The forced currents flowing in them are shown by the solid arrows. These forced currents create parasitic fields in the strip which can disrupt the magnetic domains. The direction of the parasitic fields created in the strip 12 are shown by the dashed arrows. As can be seen, depending on the direction of the forced current, one of the leads 14 will always generate a field opposite the intended stripe magnetization which is in one of either direction along the longitudinal axis of the strip 12. The effect of the parasitic field is generally confined to the area immediately surrounding the lead 14. However, since the portion of the magnetoresistive strip 12 used to sense the magnetic media is directly bounded by the lead 14, it will be affected. It is this parasitic field which disrupts the magnetic domains of the strip 12. In a wide track system, the disruption is not as severe because it is localized around the leads 14, leaving much of the area between the leads 14 unaffected. However, as the track width is narrowed, the disruption becomes progressively worse because a larger percentage of the area between the leads 14 is affected.

Accordingly, it is an object of the present invention to provide an apparatus and method for monitoring the resistance of the magnetoresistive strip which does not induce parasitic fields which can disrupt the magnetic domains of the strip material between the sensing leads. This in turn would allow the use of narrow track widths without the noise experienced in current read head assemblies.

In addition, further objects and benefits of the invention will become apparent from the detailed description which follows hereinafter when taken in conjunction with the drawing figures which accompany it.

SUMMARY

The foregoing objects have been attained generally by a read head for sensing recorded data from tracks on moving magnetic media in magnetic storage devices. By way of example, the moving magnetic media could be a tape or disk used in a magnetic storage device such as a tape drive or disk drive.

The read head includes a magnetoresistive sensor element for sensing data recorded on the tracks of the moving magnetic media, and a circuit connected to the sensor element. The circuit is used to electrically activate the sensor element and to monitor the voltage across an active sensing portion of the sensor element. However, the circuit accomplishes this function without creating longitudinal magnetic fields near the active sensing portion. This reduces a source of magnetic instability and enhances the ability of the sensor element to read data from the track of the moving magnetic media, regardless of the width of the track. Accordingly, the problems of the prior art are overcome.

The magnetoresistive sensor element in a preferred embodiment of the present invention includes a strip of magnetoresistive material having first and second ends, and a length between these ends exceeding that of the width of a track on the moving magnetic media. The strip of magnetoresistive material extends perpendicular to the direction of movement of the moving magnetic media, and is positionable such that its active sensing region is in a transducing relationship with a track on the moving magnetic media.

A preferred embodiment of the aforementioned circuit includes a pair of voltage-sensing leads operably connected across at least a portion of the width of the strip of magnetoresistive material. The voltage-sensing leads are spaced apart a distance approximately equal to the width of the track on the moving magnetic media, such that the area of the strip of magnetoresistive material between the pair of voltage-sensing leads forms the active sensing region. The circuit also includes a pair of current feed leads operably connected across at least a portion of the width of the strip of magnetoresistive material. A first current feed lead is connected on one side of the pair of voltage-sensing leads, and a second current feed lead is connected on the opposite side of the pair of voltage-sensing leads. Preferably, the first and second current feed leads are respectively connected to the first and second ends of the strip of magnetoresistive material, thereby spacing each current feed lead as far from its adjacent voltage-sensing lead as possible.

A device for applying a known drive current is operably connected to the pair of current feed leads, such that current flows from the first current feed lead, through the strip of magnetoresistive material, to the second current feed lead. In addition, a device for monitoring the voltage across the active sensing region of the strip of magnetoresistive material is operably connected to the pair of voltage-sensing leads. Preferably, this voltage monitoring device is a high impedance voltage sensor. A high impedance voltage sensor is employed to minimize current in the voltage sensing leads, and so minimize the parasitic fields associated with this current.

In use, the strip of magnetoresistive material is placed adjacent to the moving magnetic media such that the active sensing area between the voltage-sensing leads is in approximate registration with a data track of the magnetic media. A known current is feed through the strip via the current feed leads. Meanwhile, the voltage sensor is used to monitor the voltage within the active sensing area, via the voltage-sensing leads. The voltage measurements, which are representative of the resistance of the magnetoresistive material, are used to interpret the data encoded on the magnetic media.

The magnetic domain disrupting parasitic fields caused by the current feed are generally localized around the current feed leads, as described previously. Since these leads are now removed from the vicinity of the voltage-sensing leads, the magnetic domains of the magnetoresistive material in the active sensing area of the strip between the voltage-sensing leads will be unaffected. Accordingly, the width of a track on the moving magnetic media can be as narrow as desired, with no detrimental noise effects.

DESCRIPTION OF THE DRAWINGS

These and other features, aspects, and advantages of the present invention will become better understood with regard to the following description, appended claims, and accompanying drawings where:

FIG. 1 is a perspective view of a portion of a prior art magnetoresistive read head, having a magnetoresistive sensing element and two current feed leads, showing the direction of currents and parasitic fields within the read head.

FIG. 2 is a schematic illustration of a typical prior art magnetoresistive read head, including an exemplary portion of a magnetic recording medium positioned for sensing by the read head.

FIG. 3 is a schematic illustration of an embodiment of a magnetoresistive read head according to the present invention, including an exemplary portion of a magnetic recording medium positioned for sensing by the read head.

DETAILED DESCRIPTION OF THE PREFERRED EMBODIMENT

The read head assembly of the present invention transforms magnetically encoded data into electrical signals in a manner which is well known in the art. As shown in FIG. 2 of the drawings, a typical magnetoresistive read head includes a magnetoresistive strip 12, having a single pair of signal conducting leads 14. The signal conducting leads 14 are connected to a current source 18 which drives the magnetoresistive strip 12, and to a voltage sensing device 20 which senses changes in voltage across the magnetoresistive strip 12. A magnetic tape or disk 22 having a track of recorded data, is disposed adjacent to the magnetoresistive strip 12. The width of the track is approximately equal to the distance 24 between the inner edge 26 and the inner edge 28 of the signal conducting leads 14. It is noted that the direction of movement of the magnetic tape or disk 22 is substantially perpendicular to the face of the magnetoresistive strip shown in FIG. 1 (i.e. into or out of the page).

An embodiment of the present invention is shown in FIG. 3. A magnetoresistive strip 102 is positioned over and perpendicular to the direction of movement of a track 103 of magnetic media 104. By way of example, the magnetic media 104 may be a tape mounted in a removable tape cartridge and the read head assembly may be mounted in a tape drive unit.

A pair of voltage-sensing leads 106 is connected to the magnetoresistive strip 102 close to the middle and preferably at a 90 degree angle, as shown in FIG. 3. The opposing inside edges 108, 110 of the two voltage-sensing leads 106 are spaced apart a distance 111 approximately equal to the width of the track 103 on the magnetic media 104. The leads 106 are connected to a high impedance voltage sensor 112 to sense the voltage drop. Ideally, no current flows through the voltage-sensing leads 106. This ensures the resistance of the leads 106 does not affect the voltage measurement.

A pair of current feed leads 114 is also connected to the magnetoresistive strip 102. One current feed lead 114 is placed on one side of the voltage-sensing leads 106, and the other lead 114 is placed on the opposite side of the voltage-sensing leads 106. The leads 114 are connected on their opposite ends to a current source 116.

The current feed leads 114 are spaced as far from the voltage-sensing leads 106 as possible. In this way, the parasitic fields induced by the current feed leads 114, which are localized around the leads 114, will not affect the active sensing area 118 of the strip 102. Preferably, for example, the leads 114 are connected to respective ends of the magnetoresistive strip 102.

The magnetoresistive read head of FIG. 3 operates as follows. The magnetoresistive strip 102 of the read head is placed adjacent to the moving magnetic media 104 such that the active sensing area 118 between the voltage-sensing leads 106 is in approximate registration with a data track 103 of the magnetic media 104. A known current is forced through the strip 102 via the current feed leads 114. Meanwhile, the voltage sensor 112 is used to monitor the voltage across the active sensing area 118, via the voltage-sensing leads 106. The voltage measurements are representative of the resistance of the strip material in the active sensing region 118. These measurements are in turn used to interpret the data encoded on the magnetic media 104. The last two steps are accomplished via existing methods well known in the art.

As can be seen, using separate pairs of current feed leads 114 and voltage-sensing leads 106 in the above-described 4-point sensing system, allows the resistance of the magnetoresistive strip 102 to be monitored in the active sensing area 118, without inducing parasitic fields which can disrupt the magnetic domains of the strip material in the active sensing area 118. The distance 111 between the voltage-sensing leads 106 can, therefore, be made extremely small. This allows for extremely narrow track widths and higher storage densities, without the noise associated with such narrow widths experienced in current 2-point sensing systems. Thus a key object of the present invention is achieved.

While the invention has been described in detail by reference to the preferred embodiment described above, it is understood that variations and modifications thereof may be made without departing from the true spirit and scope of the invention.

Wherefore, what is claimed is:

1. A magnetoresistive read head for sensing recorded data from tracks on moving magnetic media, said magnetoresistive read head comprising:

(a) an elongated strip of magnetoresistive material having first and second ends, and a length between the first and second ends exceeding that of a width of a track on the moving magnetic media, said strip of magnetoresistive material extending perpendicular to a direction of movement of the moving magnetic media, and being positionable such that an active sensing region thereof is in a transducing relationship with a track on the moving magnetic media;

(b) a pair of elongated voltage-sensing leads connected to a voltage meter and directly contacting at least a portion of a width of the strip of magnetoresistive material at a 90 degree angle, said pair of voltage-sensing leads being spaced apart along the length of the strip of magnetoresistive material a distance approximately equal to the width of the track on the moving magnetic media, and wherein the area of the strip of magnetoresistive material between the pair of voltage-sensing leads forms the active sensing region and does not have equipotential strips located thereon; and, (c) a pair of elongated current feed leads receiving current from a current source and directly contacting, separate from said voltage-sensing leads, at least a portion of the width of the strip of magnetoresistive material, a first current feed lead of which is connected on one side of the pair of voltage-sensing leads and a second current feed lead of which is connected on the opposite side of the pair of voltage-sensing leads, wherein no equipotential strips are located on the areas of the strip of magnetoresistive material between the first current feed lead and one of the pair of voltage-sensing leads and between the second current feed lead and the opposite one of the pair of voltage-sensing leads, and wherein said current feed leads directly contact said strip of magnetoresistive material a sufficient spaced apart distance from said voltage-sensing leads so that parasitic fields induced in the strip of magnetoresistive material is localized near each respective current feed lead directly contacting said strip of magnetoresistive material so that the current feed leads do not significantly disrupt magnetic domains within the active sensing region between the pair of voltage-sensing leads.

2. A magnetoresistive read head in accordance with claim 1, wherein:

the first and second current feed leads are respectively connected to the first and second ends of the strip of magnetoresistive material, thereby spacing each current feed lead as far from an adjacent voltage-sensing lead as possible.

3. A magnetoresistive read head in accordance with claim 1, further comprising:

means operably connected to the pair of current feed leads for applying a known drive current such that current flows from the first current feed lead, through the strip of magnetoresistive material, to the second current feed lead.

4. A magnetoresistive read head in accordance with claim 1, further comprising:

means operably connected to the pair of voltage-sensing leads for monitoring the voltage across the active sensing region of the strip of magnetoresistive material.

5. A magnetoresistive read head in accordance with claim 5, wherein:

the means for monitoring the voltage across the active sensing region is a high impedance voltage sensor.

6. A magnetic storage device, including a read head for sensing recorded data from tracks on moving magnetic media, said read head comprising:

(a) a magnetoresistive sensor element for sensing data recorded on the tracks of the moving magnetic media; and, (b) a circuit, connected to the sensor element, for electrically activating the sensor element and monitoring the voltage across an active sensing portion of the sensor element corresponding to a width of a track on the moving magnetic media, said circuit comprising first and second current lead means directly contacting the magnetoresistive sensor element for feeding current across at least a portion of the magnetoresistive sensor element near said first and second current lead means and first and second voltage lead means directly contacting the magnetoresistive sensor element independent from the first and second current lead means and disposed inbetween the first and second current lead means for monitoring the voltage across the active sensing portion of the sensor element, wherein said first and second voltage lead means independently and directly contacts the magnetoresistive sensor element a spaced apart predetermined distance from said first and second current lead means directly contacting the magnetoresistive sensor element so that parasitic fields induced in the strip of magnetoresistive material is localized near said first and second current lead means directly contacting the magnetoresistive sensor element;

(c) wherein no equipotential strips are located on the areas of the strip of magnetoresistive material between the first current lead means and the first voltage lead means, between the second current lead means and the second voltage lead means, and between the first and second voltage lead means.

7. A magnetic storage device in accordance with claim 6, wherein the magnetoresistive sensor element comprises:

a strip of magnetoresistive material having first and second ends, and a length between the first and second ends exceeding that of the width of a track on the moving magnetic media, said strip of magnetoresistive material extending perpendicular to a direction of movement of the moving magnetic media, and being positionable such that the active sensing region thereof is in a transducing relationship with a track on the moving magnetic media.

8. A magnetic storage device in accordance with claim 7, wherein:

(a) the second lead means comprises a pair of voltage-sensing leads operably connected across at least a portion of a width of the strip of magnetoresistive material, said pair of voltage-sensing leads being spaced apart along the length of the strip of magnetoresistive material a distance approximately equal to the width of the track on the moving magnetic media, and wherein the area of the strip of magnetoresistive material between the pair of voltage-sensing leads forms the active sensing region; and, (b) the first lead means comprises a pair of current feed leads operably connected across at least a portion of the width of the strip of magnetoresistive material, a first current feed lead of which is connected on one side of the pair of voltage-sensing leads and a second current feed lead of which is connected on the opposite side of the pair of voltage-sensing leads.

9. A magnetic storage device in accordance with claim 8, wherein:

the first and second current feed leads are connected to the strip of magnetoresistive material at connection points such that there is a sufficient spacing along the length of the strip of magnetoresistive material between each current feed lead and an adjacent voltage-sensing lead that parasitic fields induced in the strip of the magnetoresistive material near the connection points of the current feed leads do not significantly disrupt magnetic domains within the active sensing region between the pair of voltage-sensing leads.

10. A magnetic storage device in accordance with claim 8, wherein:

the first and second current feed leads are respectively connected to the first and second ends of the strip of magnetoresistive material, thereby spacing each current feed lead as far from an adjacent voltage-sensing lead as possible.

11. A magnetic storage device in accordance with claim 8, wherein the first lead means further comprises:

means operably connected to the pair of current feed leads for applying a known drive current such that current flows from the first current feed lead, through the strip of magnetoresistive material, to the second current feed lead.

12. A magnetic storage device in accordance with claim 8, wherein the second lead means further comprises:

means operably connected to the pair of voltage-sensing leads for monitoring the voltage across the active sensing region of the strip of magnetoresistive material.

13. A magnetic storage device in accordance with claim 12, wherein the means for monitoring the voltage across the active sensing region comprises:

a high impedance voltage sensor.

14. A method of sensing recorded data from tracks on moving magnetic media, comprising the steps of:

(a) positioning a track of the moving magnetic media for sensing by a read head having a magnetoresistive sensor element, such that the magnetoresistive sensor element extends perpendicular to a direction of movement of the moving magnetic media and an active sensing region thereof is in a transducing relationship with the track on the moving magnetic media;

(b) electrically activating the magnetoresistive sensor element via first and second current lead means directly contacting the magnetoresistive sensor element for feeding current across at least a portion of the magnetoresistive sensor element near said first and second current lead means; and, (c) monitoring the voltage across an active sensing portion of the magnetoresistive sensor element corresponding to a width of a track on the moving magnetic media via first and second voltage lead means directly contacting the magnetoresistive sensor element and disposed inbetween the first and second current lead means, wherein said first and second voltage lead means independently and directly contacts the magnetoresistive sensor element a spaced apart predetermined distance from said first and second current lead means directly contacting the magnetoresistive sensor element so that parasitic fields induced in the strip of magnetoresistive material is localized near said first and second current lead means directly contacting the magnetoresistive sensor element, wherein no equipotential strips are located on the areas of the strip of magnetoresistive material between the first current lead means and the first voltage lead means, between the second current lead means and the second voltage lead means, and between the first and second voltage lead means.

15. A method of sensing recorded data from tracks on moving magnetic media in accordance with claim 14, wherein the step of monitoring the voltage across an active sensing portion of the magnetoresistive sensor element via second lead means comprises the steps of:

(a) operably connecting a pair of voltage-sensing leads across at least a portion of a width of the magnetoresistive sensor element, said pair of voltage-sensing leads being spaced apart along the length of the magnetoresistive sensor element a distance approximately equal to the width of the track on the moving magnetic media, and wherein the area of the magnetoresistive sensor element between the pair of voltage-sensing leads forms the active sensing region; and, (b) monitoring the voltage across the active sensing region of the magnetoresistive sensor element via the pair of voltage-sensing leads.

16. A method of sensing recorded data from tracks on moving magnetic media in accordance with claim 15, wherein the step of electrically activating the magnetoresistive sensor element via first lead means comprises the steps of:

(a) operably connecting a pair of current feed leads across at least a portion of the width of the magnetoresistive sensor element, a first current feed lead of which is connected on one side of the pair of voltage-sensing leads and a second current feed lead of which is connected on the opposite side of the pair of voltage-sensing leads; and, (b) applying a known drive current such that current flows from the first current feed lead, through the magnetoresistive sensor element, to the second current feed lead.

17. A method of sensing recorded data from tracks on moving magnetic media in accordance with claim 16, wherein the step of operably connecting the pair of current feed leads comprises the step of:

respectively connecting the first and second current feed leads to the magnetoresistive sensor element at connection points such that there is a sufficient spacing along the length of the magnetoresistive sensor element between each current feed lead and an adjacent voltage-sensing lead that parasitic fields induced in the magnetoresistive sensor element near the connection points of the current feed leads do not significantly disrupt magnetic domains within the active sensing region between the pair of voltage-sensing leads.

18. A method of sensing recorded data from tracks on moving magnetic media in accordance with claim 16, wherein the step of operably connecting the pair of current feed leads comprises the steps of:

respectively connecting the first and second current feed leads to a first and second end of the magnetoresistive sensor element along a length thereof, thereby spacing each current feed lead as far from an adjacent voltage-sensing lead as possible.

* * * * *

UNITED STATES PATENT AND TRADEMARK OFFICE
CERTIFICATE OF CORRECTION

PATENT NO. : 5,604,651
DATED : February 18, 1997
INVENTOR(S) : Asselin

It is certified that error appears in the above-indentified patent and that said Letters Patent is hereby corrected as shown below:

On the title page, please list the Assignee as ---Applied Magnetics Corporation---

Signed and Sealed this

Twenty-first Day of October 1997

Attest:

BRUCE LEHMAN

Attesting Officer     Commissioner of Patents and Trademarks